(12) United States Patent
Mandelman et al.

(10) Patent No.: US 6,281,539 B1
(45) Date of Patent: Aug. 28, 2001

(54) STRUCTURE AND PROCESS FOR $6F^2$ DT CELL HAVING VERTICAL MOSFET AND LARGE STORAGE CAPACITANCE

(75) Inventors: Jack A. Mandelman, Stormville; Rama Divakaruni, Somers, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/540,854

(22) Filed: Mar. 31, 2000

(51) Int. Cl.$^7$ .......................... H01L 27/108; H01L 29/76; H01L 29/94; H01L 31/119
(52) U.S. Cl. ............................. 257/302; 257/301
(58) Field of Search ..................... 257/295–310; 438/243–253

(56) References Cited

U.S. PATENT DOCUMENTS

| | | | |
|---|---|---|---|
| 4,830,978 | * 5/1989 | Teng et al. | 257/302 |
| 4,833,516 | 5/1989 | Hwang et al. . | |
| 4,984,039 | 1/1991 | Douglas . | |
| 5,034,787 | * 7/1991 | Dhong et al. | 257/302 |
| 5,177,576 | 1/1993 | Kimura et al. . | |
| 5,252,845 | 10/1993 | Kim et al. . | |
| 5,519,236 | 5/1996 | Ozaki . | |
| 5,529,944 | * 6/1996 | Rajeevakumar | 438/243 |
| 5,937,296 | 8/1999 | Arnold . | |
| 5,977,579 | 11/1999 | Noble . | |
| 6,204,140 | * 3/2001 | Gruening et al. | 438/243 |

FOREIGN PATENT DOCUMENTS

| | | |
|---|---|---|
| 0300157A2 | * 1/1981 | (EP) . |
| 0852396A2 | * 7/1998 | (EP) . |
| 407254647A | * 10/1995 | (JP) . |

* cited by examiner

*Primary Examiner*—Tom Thomas
*Assistant Examiner*—Cuong Q Nguyen
(74) *Attorney, Agent, or Firm*—Scully, Scott, Murphy & Presser; Steven Capella, Esq.

(57) ABSTRACT

A $6F^2$ memory cell comprising a plurality of capacitors each located in a separate trench that is formed in a semiconductor substrate; a plurality of transfer transistors each having a vertical gate dielectric, a gate conductor, and a bitline diffusion, each transistor is located above and electrically connected to a respective trench capacitor; a plurality of dielectric-filled isolation trenches in a striped pattern about said transistors, said isolation trenches are spaced apart by a substantially uniform spacing; a respective wordline electrically contacted to each respective gate conductor, said wordline is in the same direction as the isolation stripes; and a bitline in contact with said bitline diffusion, wherein said bitline diffusions have a width that is defined by said spacing of said isolation trenches.

18 Claims, 18 Drawing Sheets

X1-X1

Y1-Y1

Y2-Y2

Y1-Y1

Y2-Y2

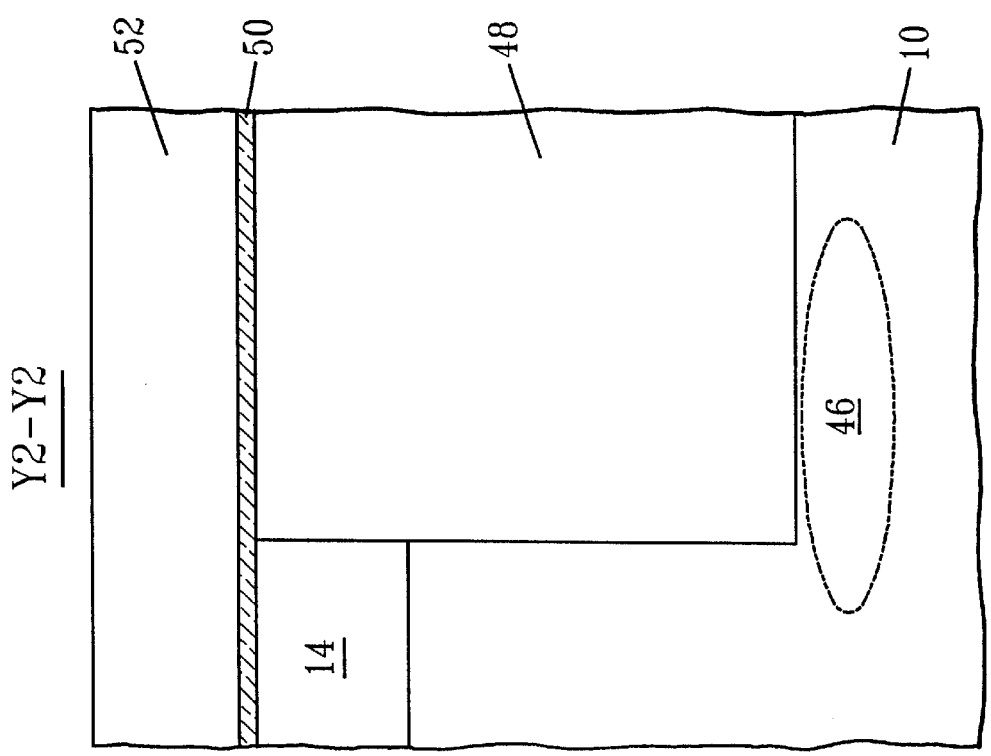
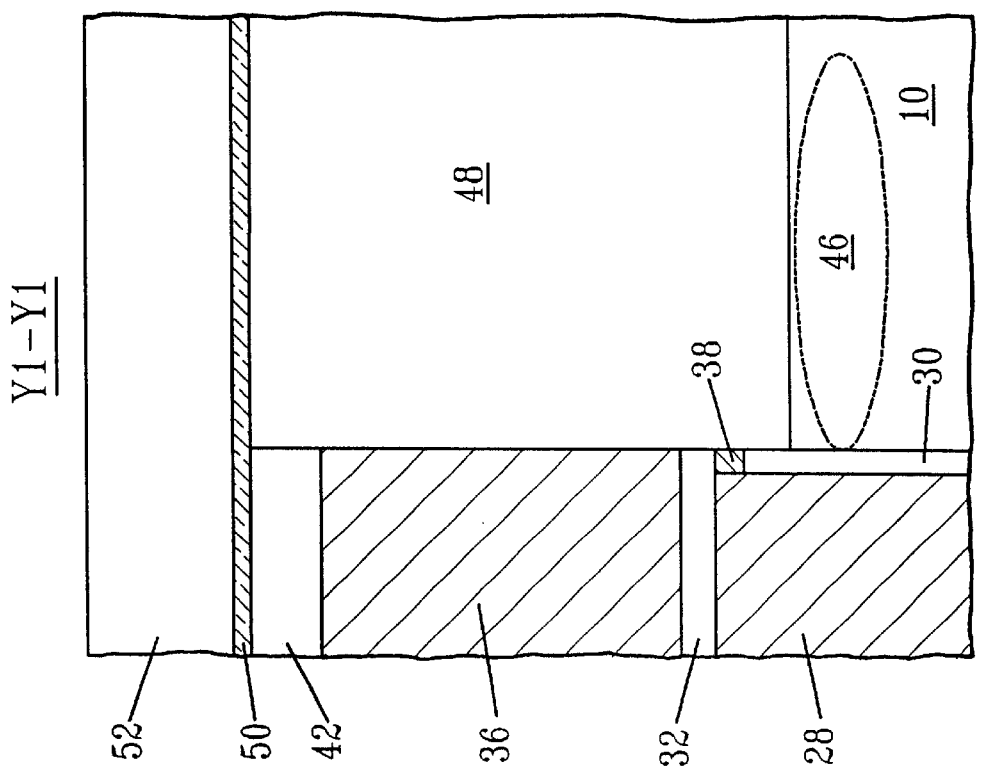
FIG. 10A
FIG. 10B

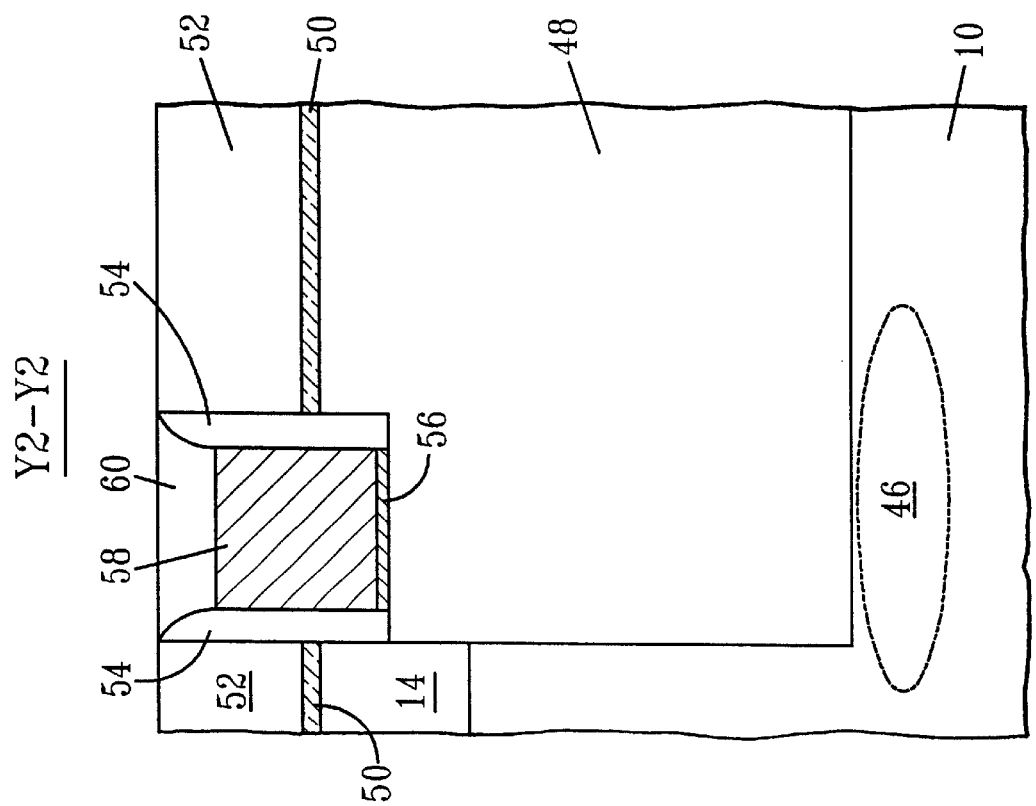
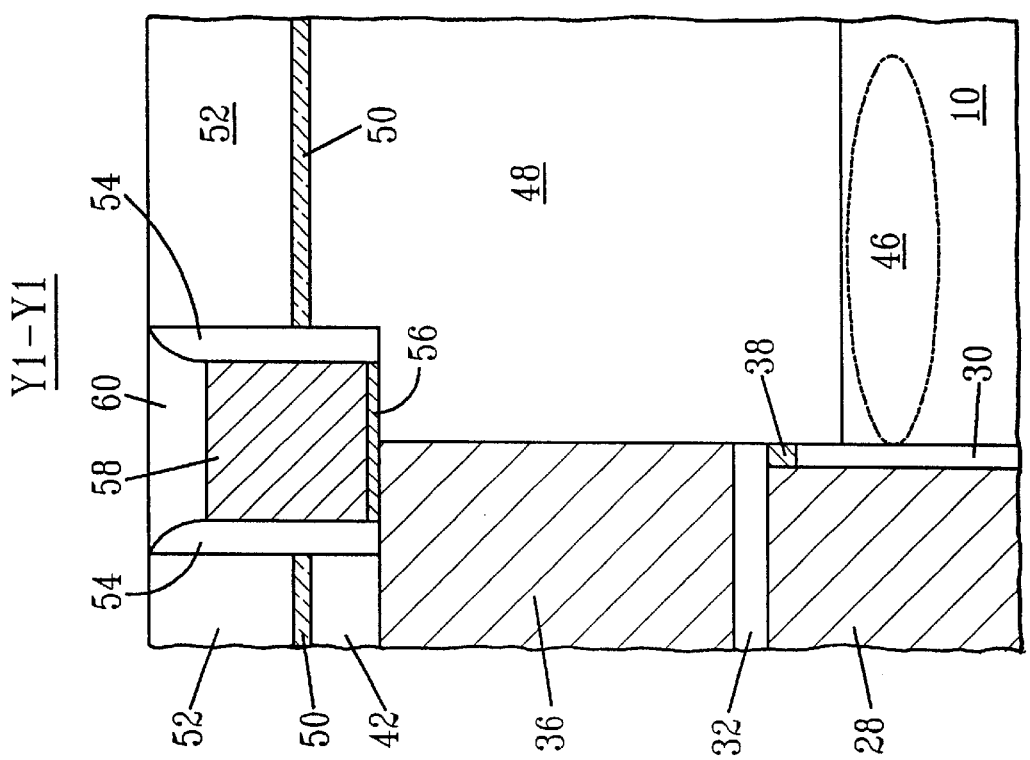
FIG.11B
FIG.11A

STRUCTURE AND PROCESS FOR 6F² DT CELL HAVING VERTICAL MOSFET AND LARGE STORAGE CAPACITANCE

FIELD OF THE INVENTION

The present invention is directed to dense memory cells, and more particular to 6F² memory cells that include vertical metal oxide semiconductor field effect transistors (MOSFETS) and large deep trench (DT) capacitors. The present invention is also directed to a process of fabricating such a memory cell.

BACKGROUND OF THE INVENTION

Present trends in dynamic random access memory (DRAM) technology are constantly driven towards reduction in minimum feature size, F, and more compact cell layouts, i.e., denser than 8F². As a result of the need for ever increasing array densities, the scalability of contemporary planar metal oxide semiconductor field effect transistor (MOSFET) cells for F=150 nm and smaller dimensions is facing fundamental concerns. The main concern with the scalability of the MOSFET cell is the increased P-well doping concentration needed to meet off-current objectives. It is well known in the art that increased array well doping concentration may result in a marked increase in array junction leakage, which degrades retention time. The problem of scalability related to the MOSFET cell, by itself, is driving the paradigm shift towards vertical MOSFET access transistors in the array.

A great depth of knowledge of, and experience with, deep trench (DT) storage capacitor technology exists. However, with increasingly smaller groundrules and denser cell layouts, the ability to obtain adequate DT storage capacitance (on the order of about 35fF) is being seriously challenged. The difficulty in obtaining adequate DT storage capacitance is due to several factors including: (1) limitations on the scalability of the thickness of the node dielectric; (2) limitations on the etch depth of the DT; and (3) reduction of capacitance area that occurs with groundrule reduction, e.g., scaling, and more dense cell layouts, i.e., 6F² and 7F² vs. 8F². Reactive-ion etching (RIE) lag effect caused by smaller storage trench openings makes etching adequate deep trenches difficult. Filling of these extremely high aspect ratio (>50:1) trenches also presents major difficulties.

Furthermore, the high aspect ratios associated with aggressively scaled DT capacitors result in increased series resistance which, in turn, results in decreased signal development within a given time window. For a 6F² cell with a near 1×1 DT opening, it is expected that the above mentioned problems of capacitance and resistance may become a major problem by the 120 nm generation. For DRAM producers who have firmly established DT capacitor technology as the main stream storage element for longer than the past decade, it would be costly to switch to an alternative storage technology such as stacked capacitors with a high dielectric constant.

Thus there is a need for DRAM cells containing vertical access transistors, dense layouts (denser than about 8F²) and trench storage capacitors which yield sufficient capacitance and reduced series resistance to avoid degraded signal development.

Although some existing DRAM cells employing vertical MOSFETs offer very significant scalability advantages over conventional planar designs practiced today, there is still a great deal of room for improvement. For example, for cells using vertical MOSFETs and trench storage capacitors, a single bitline contact is commonly used to access a pair of bits; the pair of bits share a common silicon active area (AA). In this type of cell, dynamic coupling between the two back-to-back vertical MOSFETs results in charge pumping effects and loss of signal. Modeling has shown that electrons pumped into the P-well from a collapsing channel inversion layer of one cell may be collected by the storage node of the adjacent cell sharing the same AA. These coupling effects are accentuated as dimensions are scaled down. Modeling projections indicate that scalability to 100 nm and below may be problematic because of dynamic charge loss due to coupling between adjacent cells.

In addition to charge pumping problems, very dense prior art designs suffer from threshold voltage variations in the size of the silicon AA which occurs with overlay (alignment) errors between various masking levels and with dimensional variations of features formed by these masking levels.

Another problem faced with aggressively scaled DRAM cells is the increased aspect ratio (height to width) of the isolation regions. This is especially a concern with vertical MOSFETs in the array because of the requirement that the isolation trench be deep enough to cut the strap so as to prevent cell-to-cell leakage between straps. Typically, it is required that the isolation trench be at least 500 nm in depth to isolate the straps of the vertical MOSFETs. If the thickness of the pad layer is included, an isolation trench aspect ratio of 7:1 is anticipated by the 100 nm generation.

In view of the drawbacks mentioned hereinabove with prior art DRAM cell designs, there is a continued need to develop new and improved DRAM cell designs that are denser than prior art designs and have a larger DT size. A larger DT size is advantageous in dense DRAM cells since it provides a large storage capacitance and reduced series resistance to the array cell.

SUMMARY OF THE INVENTION

One object of the present invention is to provide a dense DRAM cell (6F²) which is scalable to a minimum feature size of about 100 nm.

Another object of the present invention is to provide a dense DRAM cell wherein dynamic leakage due to adjacent cell activity is substantially eliminated.

A further object of the present invention is to provide a dense DRAM cell having a large deep trench (on the order of 2×1) size for large storage capacitance, reduced resistance and ease of fabrication.

A yet further object of the present invention is to provide a dense DRAM cell that contains an array trench isolation pattern (stripes 2F wide) that has reduced aspect ratio for simplified filling.

An additional object of the present invention is to provide a dense DRAM cell that utilizes silicon active areas whose dimension is independent of all overlay tolerances, thus greatly tightening the threshold voltage distribution.

An even further object of the present invention is to provide a fully self-aligned process of fabricating a dense DRAM cell which substantially eliminates sensitivity of AA size to all overlay variations.

These and other aspects and advantages are achieved in the present invention by utilizing storage trenches having a 2F×1F size and isolation stripes 2F wide to define an AA in combination with a vertical transistor.

In accordance with one aspect of the present invention, a 6F² memory cell is provided. Specifically, the 6F² memory cell of the present invention comprises:

a plurality of capacitors each located in a separate trench that is formed in a semiconductor substrate;

a plurality of transfer transistors each having a vertical gate dielectric, a gate conductor, and a bitline diffusion, each transistor is located above and electrically connected to a respective trench capacitor;

a plurality of dielectric-filled isolation trenches in a striped pattern about said transistors, said isolation trenches are spaced apart by a substantially uniform spacing;

a respective wordline electrically contacted to each respective gate conductor, said wordline is in the same direction as the isolation trenches; and a bitline in contact with said bitline diffusion, wherein each bitline diffusion has a width that is defined by said spacing of said isolation trenches.

In accordance to the present invention, the active area of the transfer transistors is defined by the intersection of pairs of isolation trenches and pairs of trenches containing capacitors.

Another aspect of the present invention is directed to a process of fabricating the above-mentioned $6F^2$ memory cell. Specifically, the process of the present invention comprises the steps of:

(a) providing a semiconductor substrate having a storage trench with a capacitor formed in said storage trench, said capacitor being vertically recessed from an entrance of said storage trench, said substrate having a pad dielectric material layer about an uppermost portion of said storage trench, said trench capacitor having a trench electrode and a strap electrode electrically contacting said trench electrode and a portion of said substrate about the top of said trench capacitor, said trench capacitor also including a dielectric collar material about an upper portion of said trench electrode, said collar material contacting said strap;

(b) forming a capacitor-topping dielectric layer over said strap and trench electrode, said dielectric layer extending across an entire cross-section of said storage trench, whereby a space in said storage trench above said topping dielectric layer is defined;

(c) forming a gate dielectric layer on at least a portion of a wall surface of said storage trench above said topping dielectric layer;

(d) filling said spaces above said topping dielectric layer with a gate conductor electrode material;

(e) forming a patterned photoresist layer above a portion of said gate conductor electrode, wherein a remaining portion of said gate conductor electrode is exposed;

(f) removing said exposed portion of said gate conductor electrode directionally so as to expose a portion of said topping dielectric layer;

(g) removing a portion of said exposed topping dielectric layer so as to expose a portion of said strap and said trench electrode;

(h) removing said exposed portion of said strap and a portion of said exposed trench electrode so as to expose a portion of said collar dielectric;

(i) filling spaces in said storage trench defined by steps (f)–(h) with a dielectric material different from said pad dielectric layer;

(j) forming a striped photoresist mask over said substrate, said stripe running in a direction substantially orthogonal to a principal width of said storage trench, said mask defining spaces on said substrate overlapping said storage trench;

(k) removing material from said substrate at said spaces to form isolation trenches extending into said substrate to a depth below an upper edge of said collar dielectric, said removal of material including removal of portions of said gate dielectric and said strap electrode such that the gate electrode and the strap electrode are located on a single side;

(l) removing said photoresist stripes;

(m) filling said isolation trenches with a trench isolation dielectric material different from said pad dielectric material;

(n) planarizing said isolation trenches to expose said pad dielectric material;

(o) depositing on said substrate a further layer of dielectric material different from said pad dielectric, and a layer of dielectric material of similar composition to said pad dielectric;

(p) forming a striped photoresist mask over said dielectric layers, said stripes being substantially parallel to said isolation trenches, and said stripes defining wordline location spaces overlapping a portion of said isolation trench and said storage trench;

(q) removing material at said wordline location spaces to a level causing exposure of a portion of said gate conductor;

(r) depositing a conductor in said wordline location spaces, and depositing a further dielectric material over said conductor;

(s) removing said dielectric material of similar composition as said pad dielectric and said pad dielectric material to expose a portion of said substrate; and (t) implanting into said exposed substrate to form bitline implants.

BRIEF DESCRIPTION OF THE DRAWINGS

FIGS. 1–17 depict a $6F^2$ memory cell design having large DT capacitor storage elements and vertical MOSFETs through various processing steps of the present invention.

DETAILED DESCRIPTION OF THE INVENTION

Figure 1:
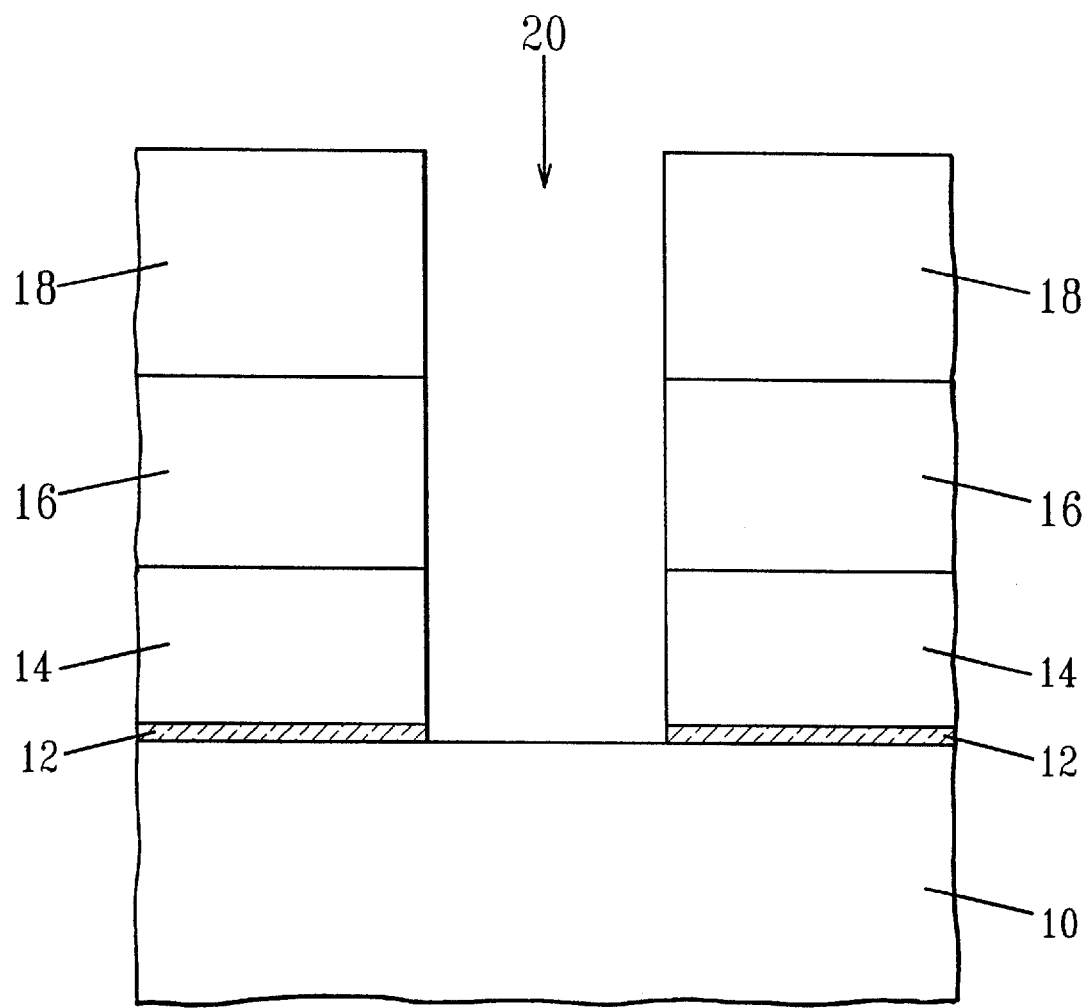

The present invention which provides a $6F^2$ memory cell having the above mentioned features and a process of fabricating the same will now be described in more detail by referring to the drawings that accompany the present application. It is noted that in the accompanying drawings like reference numerals are used for describing like and corresponding elements. It is also noted that although some of the drawings of the present application depict the presence of only one element, a plurality of elements may be present.

FIG. 1 is a cross-sectional view of an initial structure that can be used in the present invention in forming a deep trench capacitor. Specifically, FIG. 1 comprises a semiconductor substrate 10 that has a pad oxide layer 12, e.g., $SiO_2$, that is formed on the surface thereof utilizing conventional deposition techniques such as chemical vapor deposition (CVD) or plasma-assisted CVD. Alternatively, pad oxide layer 12 may be formed on the substrate by utilizing a conventional thermal growing process. The thickness of pad oxide layer 12 is not critical to the present invention, but typically pad oxide layer 12 has thickness of from about 2 to about 10nm.

The substrate employed in the present invention comprises any semiconducting material including, but not limited to: Si, Ge, SiGe, GaAs, InAs, InP and all other III/V semiconductor compounds, or substrate 10 may be composed of a layered substrate such as Si/SiGe or Si/SiO$_2$/Si (SOI). Of these semiconducting materials, it is preferred that Si be employed as the substrate.

FIG. 1 also includes a deep trench (DT) mask that is formed on the pad oxide layer utilizing conventional deposition processes well known in the art. The DT mask may comprise at least one dielectric material or, as is shown in FIG. 1, the DT mask may comprise various dielectric material layers. Specifically, the DT mask includes, a Si$_3$N$_4$ pad layer 14 formed on pad oxide layer 12 and a boron silicate glass (BSG) layer 16 that is formed over the Si$_3$N$_4$ pad layer. The dielectric layers may be deposited by the same or different deposition process and the dielectric layers may have the same or different thickness associated therewith. A layer of photoresist is formed over the BSG layer and then the photoresist is patterned utilizing conventional lithography to provide patterned photoresist 18.

As shown in FIG. 1, the patterned photoresist is then used to form opening 20 in DT mask and the pad oxide layer 12. Specifically, the opening is formed by reactive-ion etching (RIE) the various dielectric layers of the DT mask as well as the oxide pad layer, stopping on substrate 10. The etch chemistry used in this step of the present invention is highly selective for etching dielectric layers compared to silicon.

Figure 2:
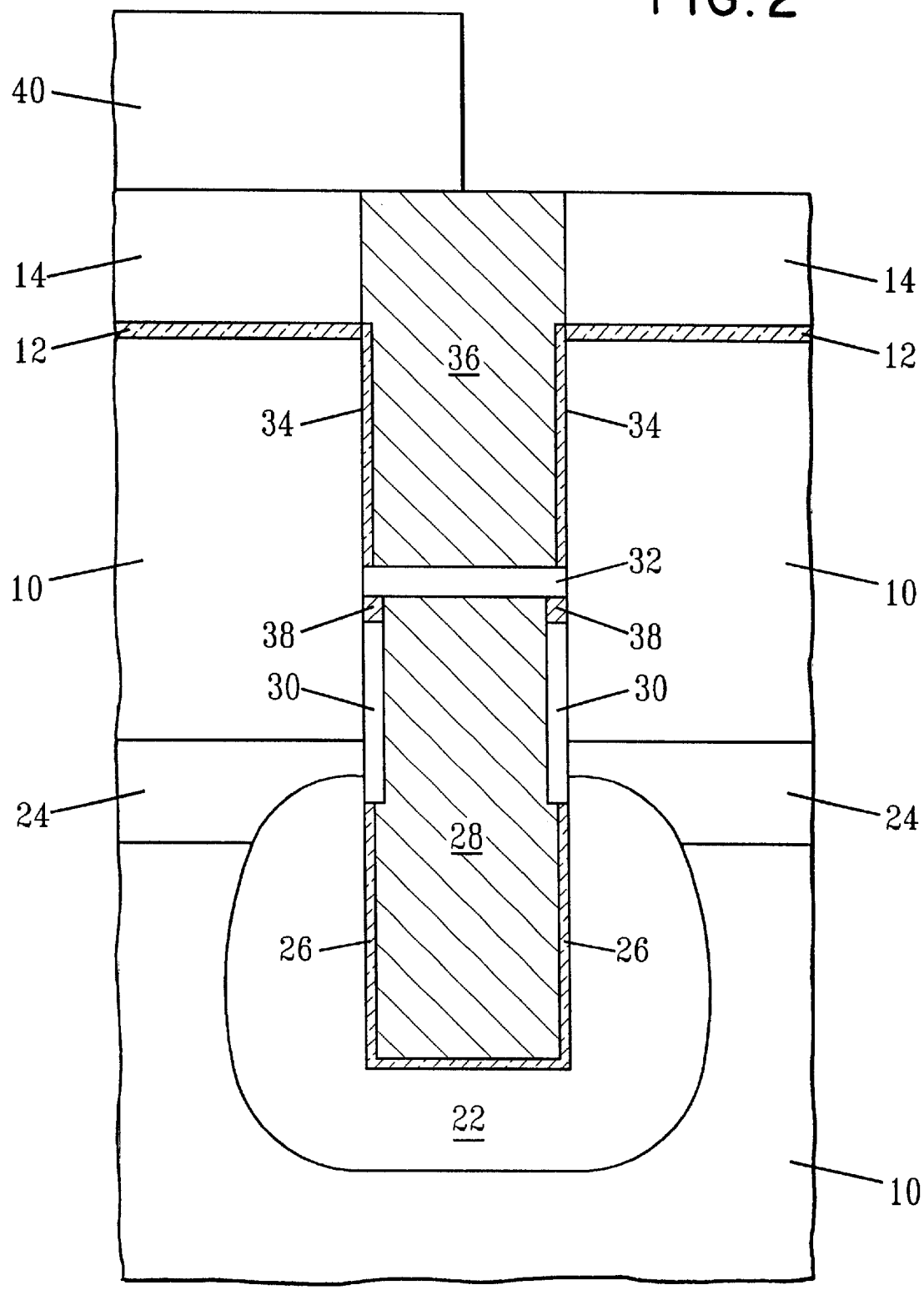

Next, as shown in FIG. 2, a storage trench having a designed rectangular shape is etched into the substrate by RIE or another like etching process. It is noted that the storage trench is a deep trench which is capable of housing the storage capacitor in a bottom region thereof, and a vertical MOSFET in an upper region. A storage capacitor is formed in the bottom region of the trench utilizing techniques that are well known to those skilled in the art. The capacitor includes at least an N+ plate 22 formed about the exterior of the trench, a N band region 24 formed in the substrate abutting the DT, a storage node dielectric 26 lining the interior sidewalls of the bottom portion of the DT and N+ polysilicon 28 formed on said storage node dielectric.

After forming the storage capacitor in the bottom portion of the trench, a collar region 30 is formed above the capacitor so as to provide isolation between the capacitor and the MOSFET utilizing techniques well known in the art. It is also within the contemplation of the present invention to form the collar region before any polysilicon is deposited in the trench. A vertical MOSFET is then formed in an upper region of the DT utilizing conventional vertical MOSFETs processing techniques that are also well known in the art. The vertical MOSFET includes a trench top oxide (TTO) dielectric 32 that is formed over a recess area provided in N+ polysilicon 28, a gate oxide (i.e., gate dielectric) 34 formed on the interior sidewalls of the trench (the gate oxide may extend to meet the pad oxide layer) and an N+ polysilicon gate conductor (poly GC) 36. The structure shown in FIG. 2 also includes a polysilicon strap region 38 that is formed on the sidewalls of the DT between the collar regions and the TTO dielectric.

The structure shown in FIG. 2 is then planarized utilizing conventional planarization techniques such as chemical-mechanical polishing (CMP) to the top surface of Si$_3$N$_4$ pad layer 14. This planarization step thus removes BSG layer 16 from the structure. It is noted that the photoresist used in defining the opening was stripped prior to forming the capacitor in the trench.

FIG. 2 also includes a patterned photoresist 40 that is formed over the structure so that an edge of the photoresist lies midway across the short dimension of the deep trench opening exposing a portion of poly GC 36. Thus, in this step of the present invention, some portions of the poly GC are protected by the photoresist, whereas other portions of the poly GC are left exposed. The patterned photoresist is formed by conventional deposition processes and lithography and etching are used in defining the pattern in the photoresist layer.

Figure 3:
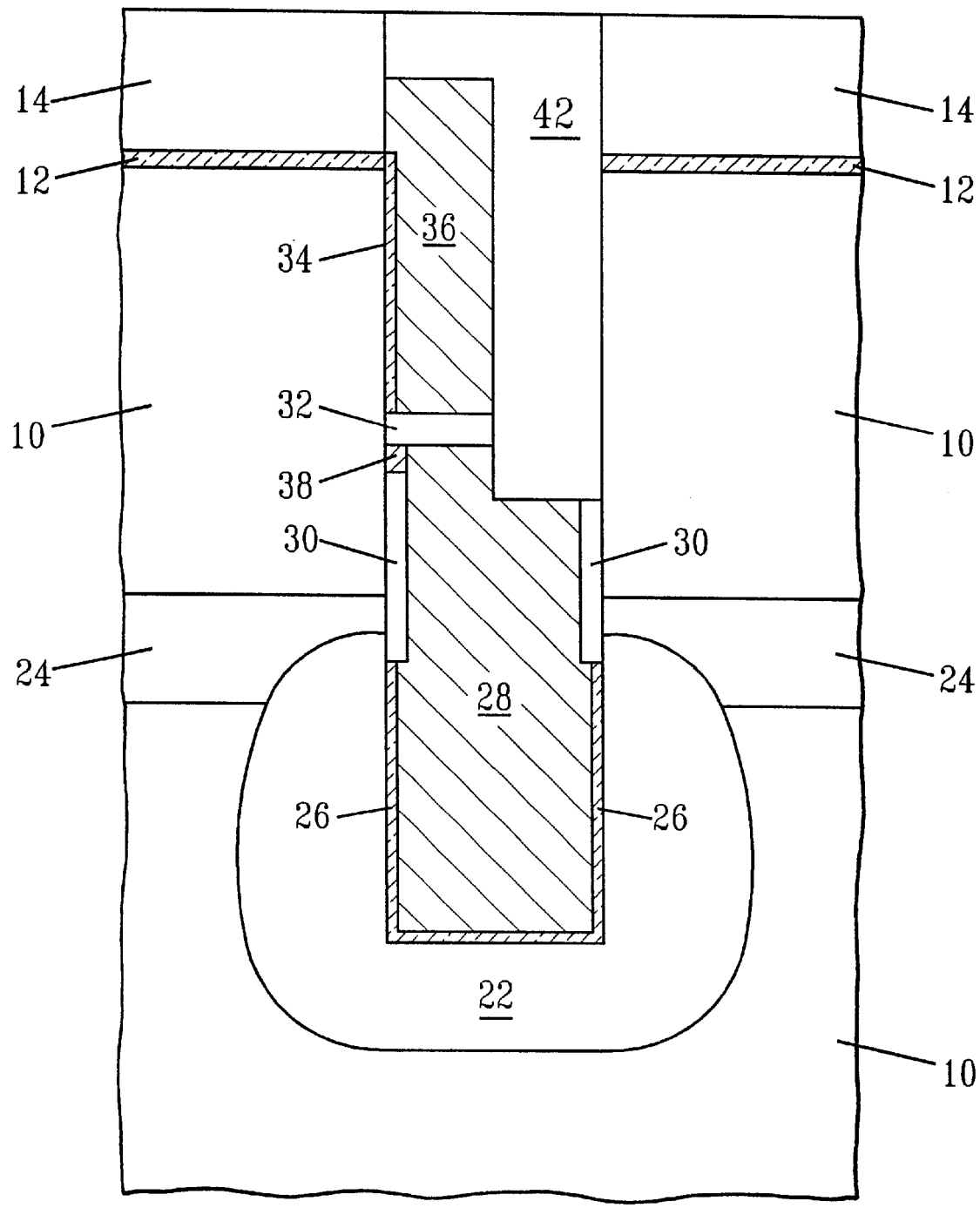

FIG. 3 shows the next steps of the present invention. Specifically, the exposed portion of the poly GC is then etched (e.g., RIE'd) selective to Si$_3$N$_4$, oxide and resist (utilizing standard GC plasma etch chemistry) stopping on the top surface of TTO dielectric 32. Patterned photoresist 40 is stripped utilizing conventional stripping processes and an oxide RIE is used to open exposed portions of TTO dielectric 32 to N+ DT poly 28, with reasonable selectivity to the Si$_3$N$_4$. The etch chemistry is then switched back to GC RIE and the exposed strap as well as exposed portions of the N+ DT poly (the top surface is recessed beneath the top surface of the Si$_3$N$_4$ pad) are removed.

A layer of oxide 42 such as CVD oxide is then formed in the etched areas utilizing conventional deposition processes well known in the art. If needed, a planarized step is used to provide a planar structure stopping at the top surface of Si$_3$N$_4$ pad 14. Although any oxide may be used, it is highly preferred in the present invention to use a high density plasma (HDP) process to form the oxide to facilitate filling the high aspect ratio of the gap between the poly GC and the sidewall of the substrate. It is noted that filling of this gap is not necessary since an interior void is allowable as long as the void is sealed at the top. Note that the process described above is adjusted such that the top surface of the poly GC is recessed to a depth which is half the thickness of the pad nitride.

To prevent unwanted formation of strap diffusion on the side of the trench which is adjacent to the oxide fill, a thin Si$_3$N$_4$ barrier layer (i.e., about 1 nm or less) may be formed prior to the deposition of the strap polysilicon. For simplicity, this barrier layer is not shown in the drawings of the present invention. The barrier nitride impedes the diffusion of dopant from the N+ DT poly into the substrate during gate oxidation. Later thermal processing breaks down this barrier layer, allowing the strap to outdiffuse on the desired side of the trench. Other options that may be employed in the present invention to impede unwanted strap outdiffusion include, but are not limited to: low temperature gate oxidation and isotropic etching of a small amount of substrate on the trench sidewall.

Figure 4:
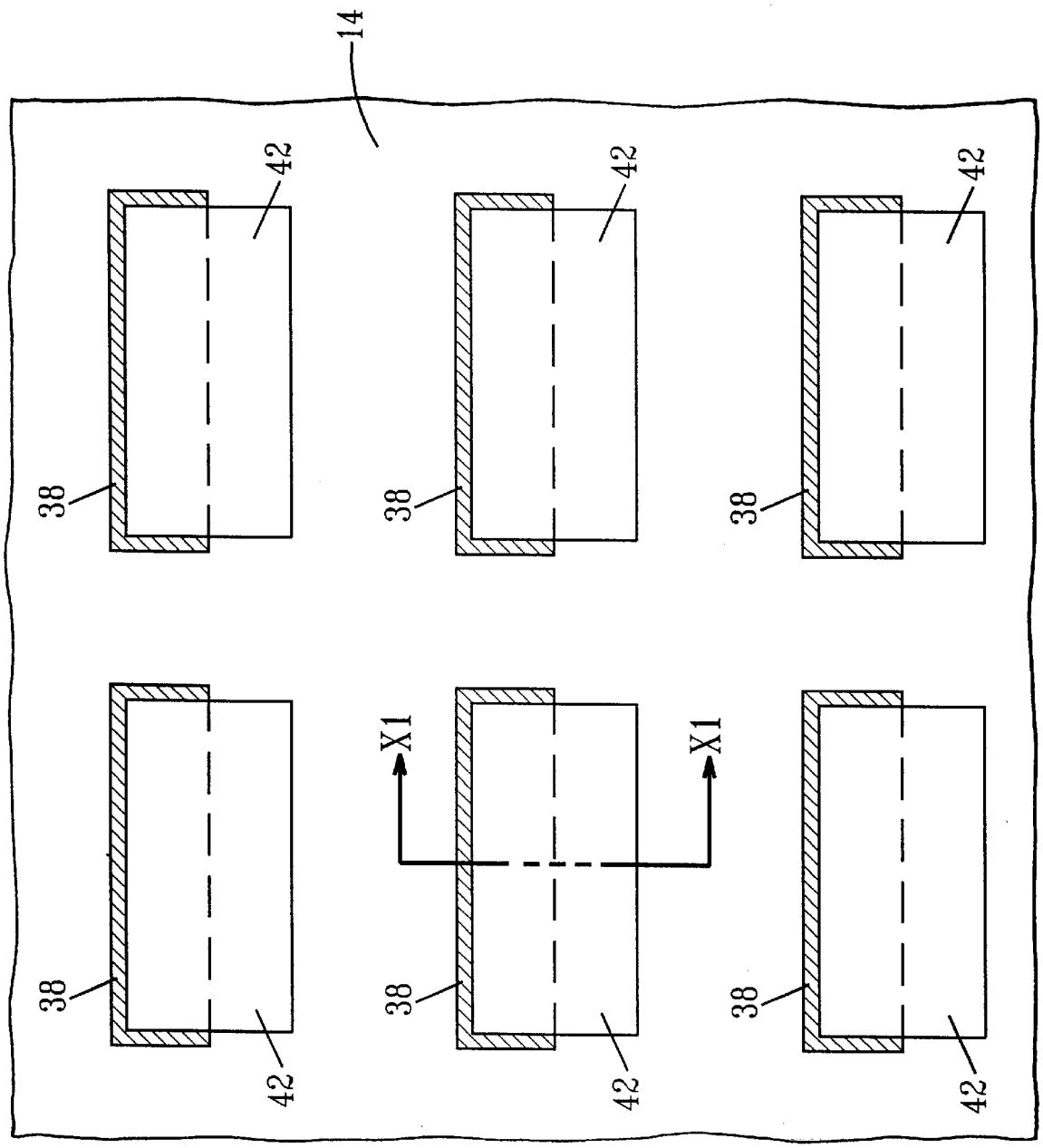

FIG. 4 shows a top view of a portion of the array at this point in the process. It is emphasized that poly GC 36 and strap 38 are removed from the lower side of the storage trench (as indicated by the horizontal line running across the width of the DT). The strap and poly GC, however, remain on the upper side of the DT.

Figure 5:
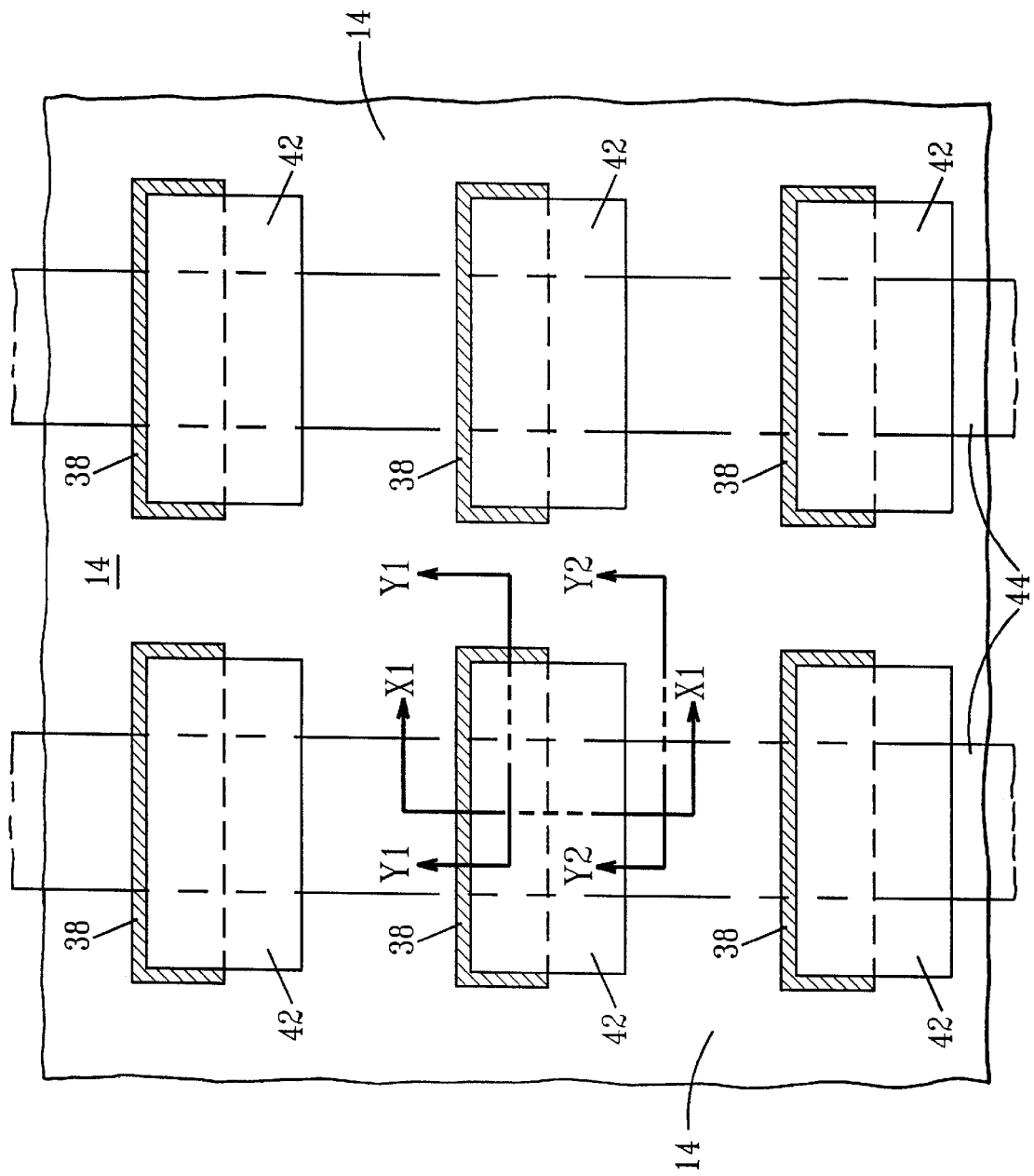
Figure 6A:
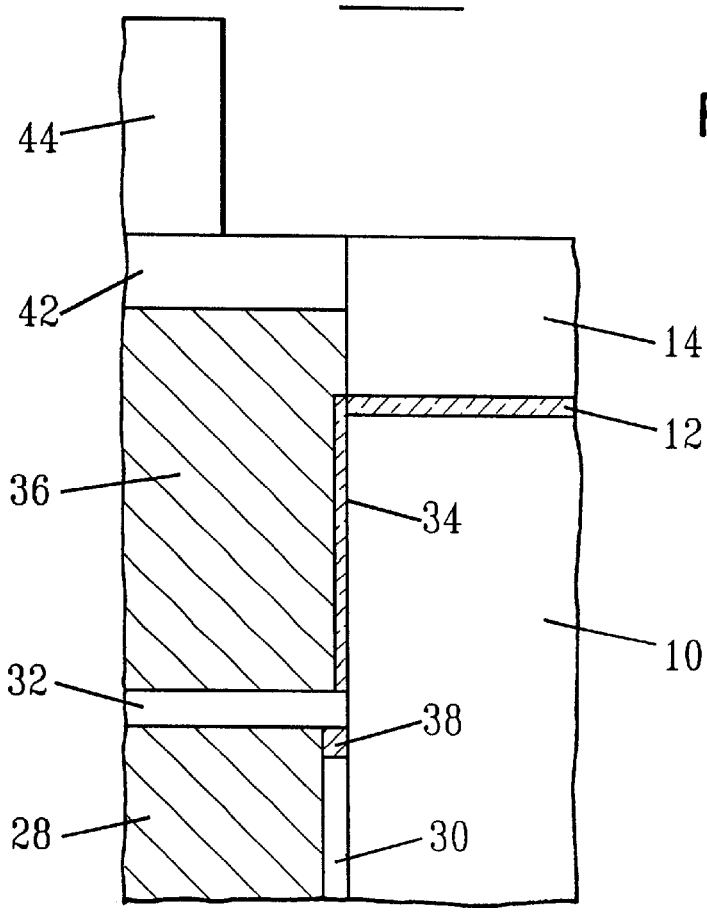
Figure 6B:
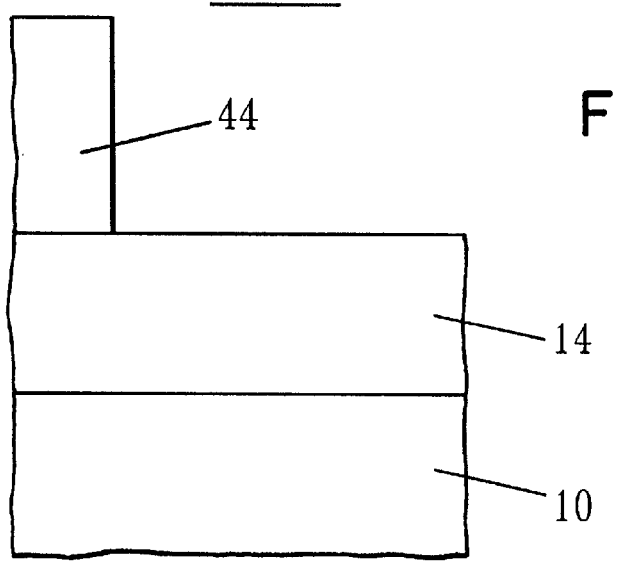

Isolation regions (e.g., shallow trench isolation (STI) regions) are then formed in the structure utilizing conventional techniques well known in the art. FIG. 5, which is a top view of the structure, shows the placement of the isolation masks 44 relative to the DT pattern. The distance between the isolation stripes is about 2F minimum feature sizes wide. An isolation pattern stripe protects the central portion of each DT. FIGS. 6A–B show the edge of the isolation mask through cross-sections Y1—Y1 and Y2—Y2, respectively.

Figure 7A:
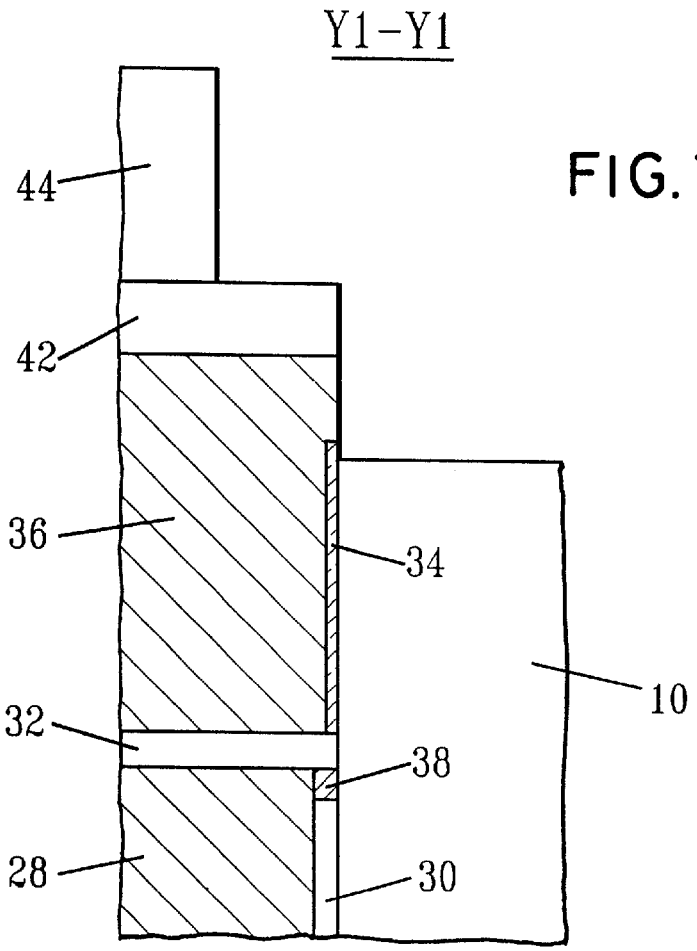
Figure 7B:
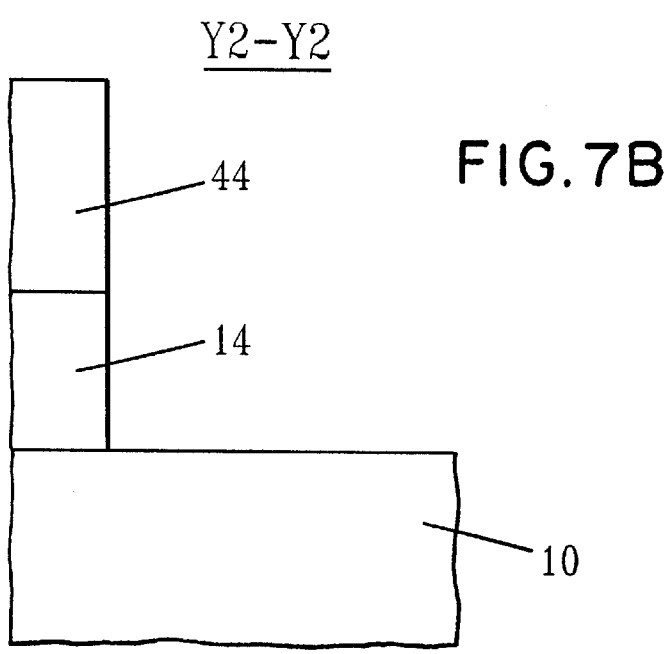

Next, as is shown in FIGS. 7A–B, the exposed pad nitride, i.e., Si$_3$N$_4$ pad layer 14, is then etched (e.g., RIE'd) selective to the substrate, oxide and isolation mask until it is removed.

Figure 8A:
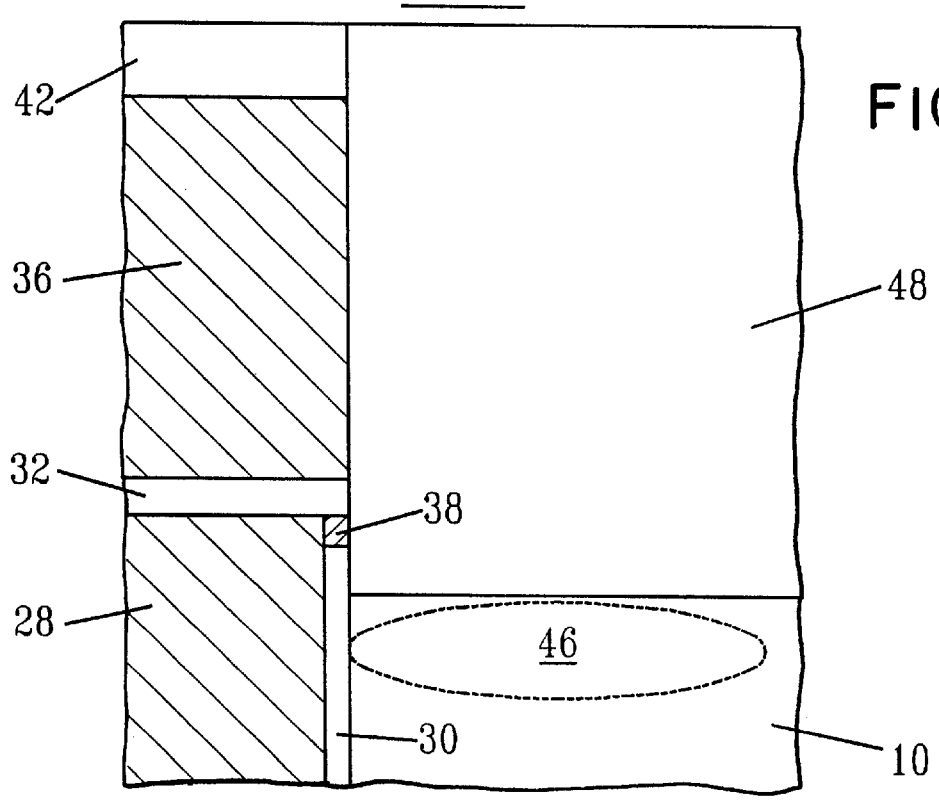
Figure 8B:
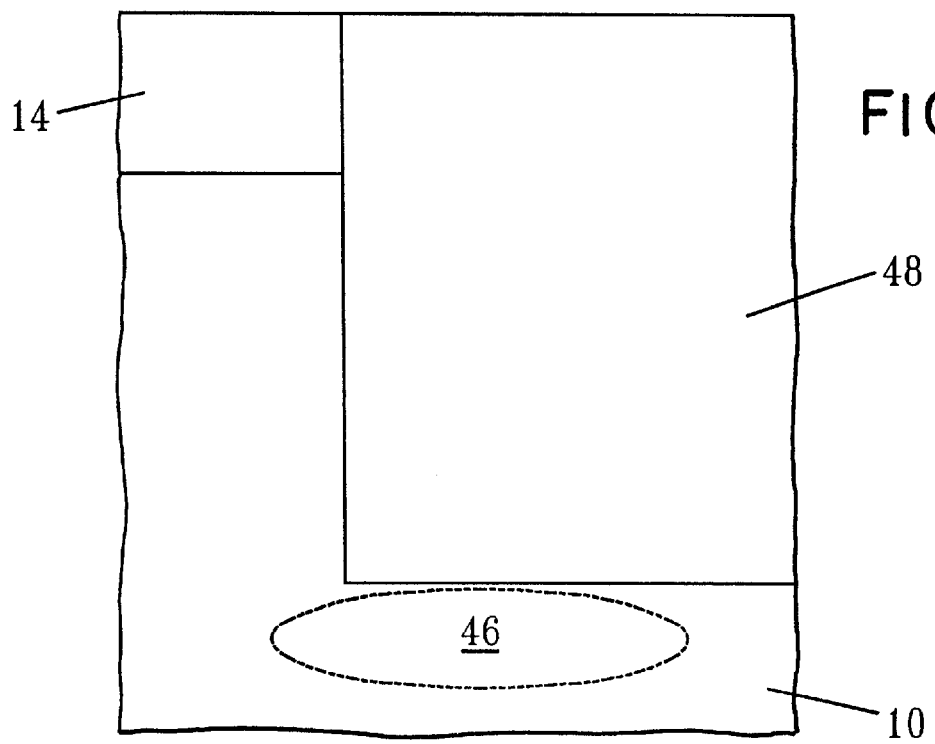

FIGS. 8A–B are cross-sectional views showing the next steps of the present invention. Specifically, the exposed substrate is etched selective to oxide and isolation mask. The isolation mask is then stripped. A standard thermal oxide (e.g., STI oxide) may then be grown on the surface of the isolation trench to heal any damage that may have occurred to the substrate during any of the above mentioned etching steps. The bottom of the isolation trench in the array and in the support P-wells are implanted with boron to provide a locally higher doping concentration to enhance the isolation properties of the isolation trench, by raising the threshold voltage of the thick oxide parasitic MOSFET. Region 46 represents an enhanced doping region that is formed in the bottom of the isolation trench.

A CVD oxide or other like trench dielectric is then deposited into the isolation trench by conventional deposition processes and planarized by conventional planarization techniques to the top surface of the nitride pad forming isolation regions 48 in the structure. It is again noted that the width of the isolation stripes is approximately 2F, which halves the aspect ratio to be filled compared to standard isolation methods. This relaxed aspect ratio that is obtained in the present invention greatly simplifies the process in filling the isolation region. Support area isolation is also formed during this step of the present invention.

Figure 9:
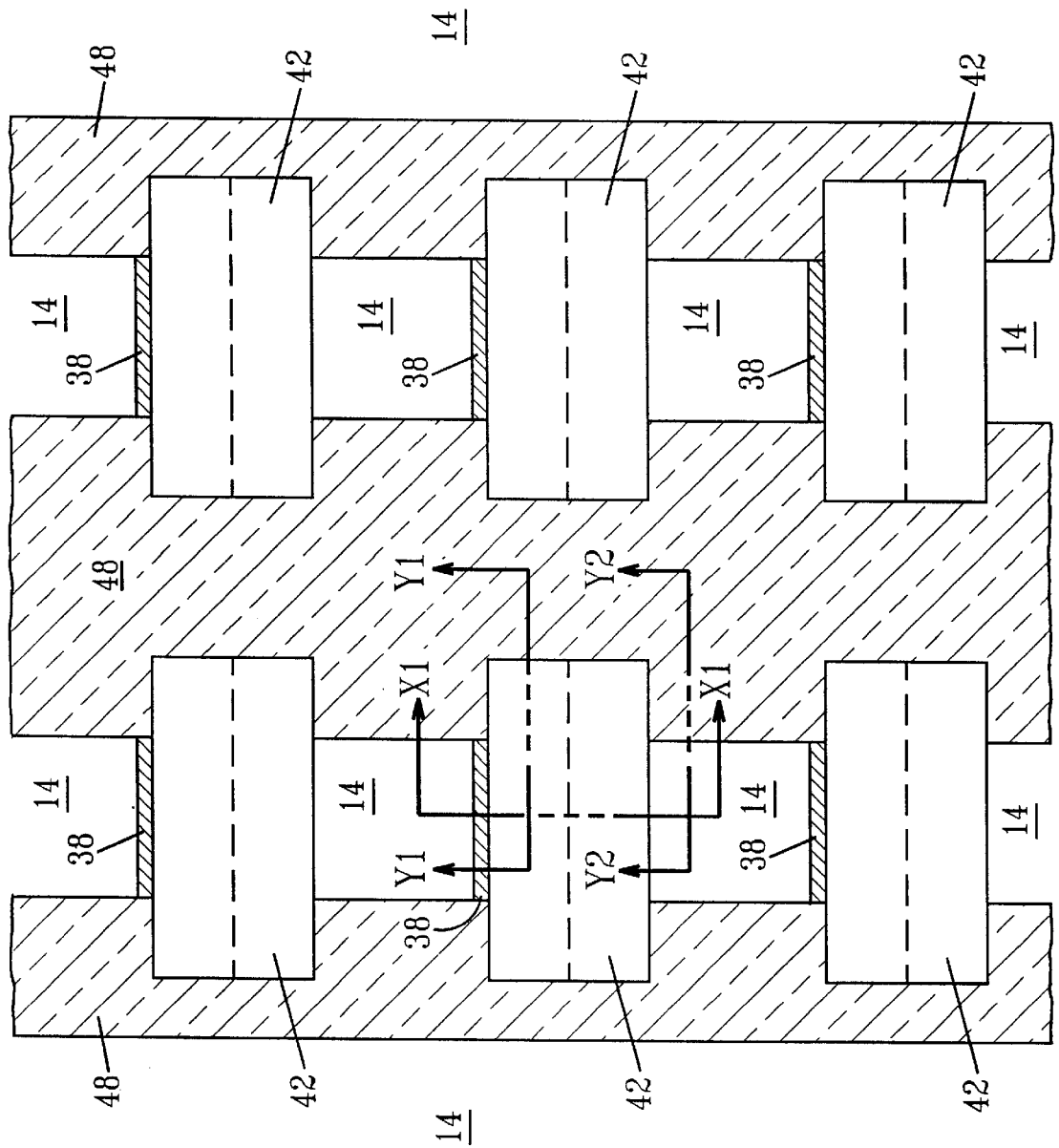

FIG. 9 illustrates a top view of the structure after forming isolation regions 48 in the structure. Each isolation stripe is approximately 2F wide and nominally overlaps the edge of the DT by about 0.5F. This amount of overlap assures that the isolation regions overlap the DT even for worst case misalignment. Therefore, the dimensions of the active area (AA) bounded by two adjacent isolation stripes and by two adjacent DT's is independent of misalignment errors between DT and isolation region. This feature provides greatly improved threshold voltage control for the array vertical MOSFET.

The next steps of the present invention include the formation of wordlines. The wordlines are formed by depositing a thin oxide layer 50 on the planarized surface of the structure, See FIGS. 10A–B. The thin oxide typically has a thickness of from about 5 to about 15 nm and it serves as an etch stop layer for a subsequent $Si_3N_4$ etch. Next, a thick (100–400mn) layer of $Si_3N_4$ 52 is deposited on the thin oxide layer utilizing conventional deposition techniques well known to those skilled in the art. It is noted that the sum of the thicknesses of the oxide layer and the top nitride layer determines the thickness of the wordline conductor stack which is subsequently formed.

Next, as shown in FIGS. 11A–B, a wordline stripe mask (not shown in the drawings) is used to define RIE'd openings in the oxide and nitride layers. Specifically, top $Si_3N_4$ layer 52 is RIE'd open selective to oxide, stopping on oxide layer 50. The thin oxide layer is then RIE'd selective to nitride, exposing the top surface of the poly GC in the top portion of the DT. In the event of a misalignment, such that a portion of the wordline mask overlaps the unetched substrate (beyond the edge of the isolation region), the oxide RIE, which is selective to nitride, will leave insulating nitride layer 14 between the bottom of the wordline conductor and the substrate. This prevents shorting between the wordline and the substrate.

Oxide spacers 54 are then formed in a manner well known to those skilled in the art, i.e., deposition and directional etching. A layer of WN or other suitable conductive diffusion barrier 56 is next deposited utilizing conventional deposition processes. A layer of highly conductive material 58, such as W or silicide, is deposited, planarized and recessed beneath the top surface of the top nitride layer. A layer of CVD oxide 60 is then deposited and planarized. It is noted that in FIGS. 11A–B, that wordline 58 contacts the gate conductor of the vertical MOSFET.

Figure 12:
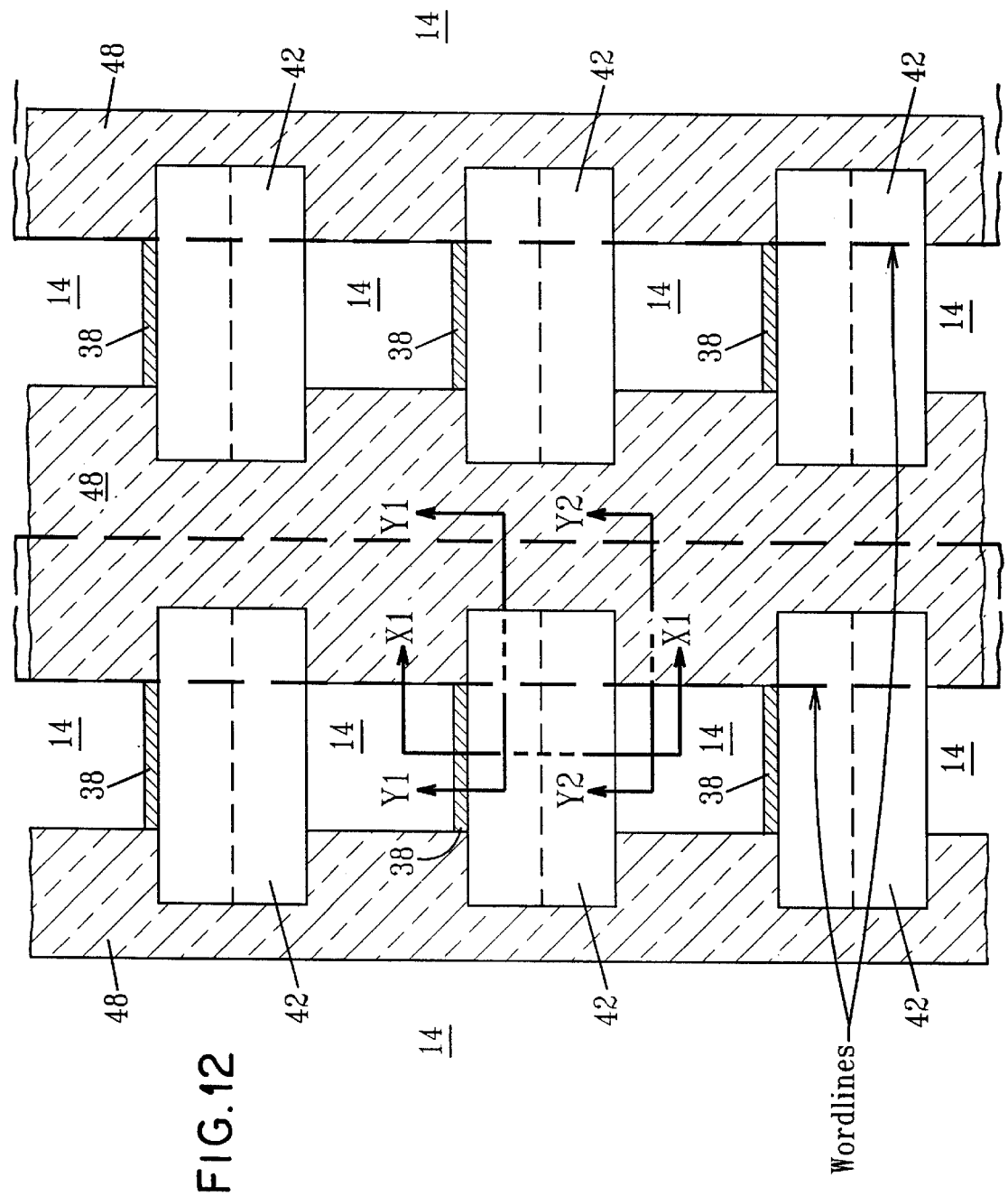

A top view of the structure after formation of the wordline is shown in FIG. 12. Specifically, FIG. 12 shows the location of the wordlines relative to the DTs and isolation regions.

Figure 13B:
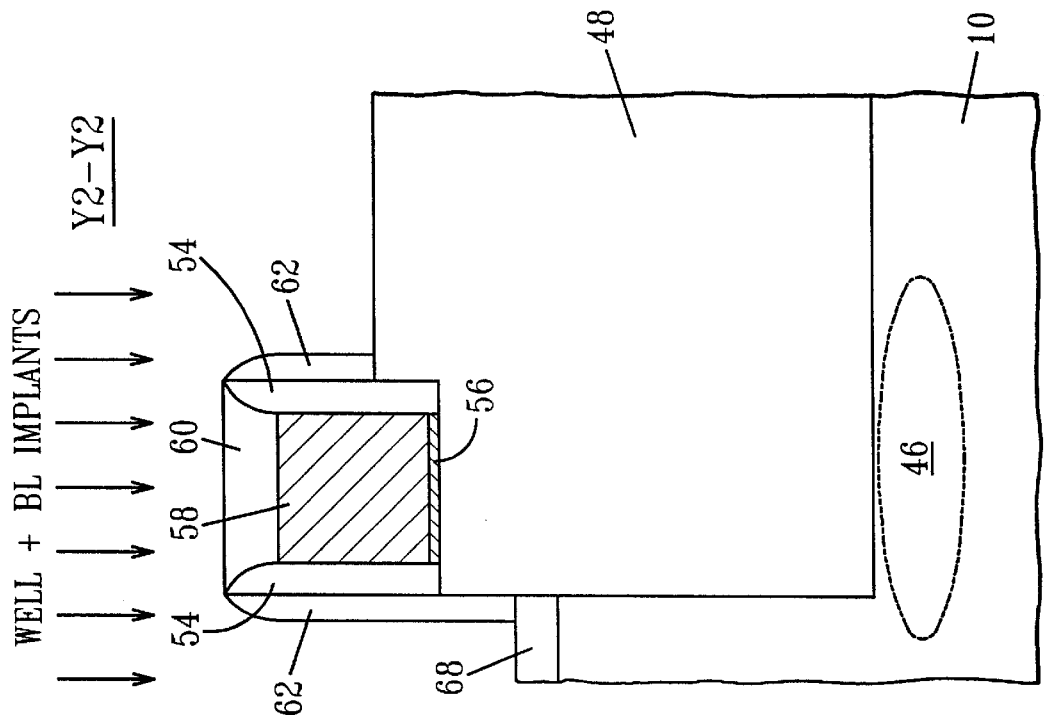
Figure 13A:
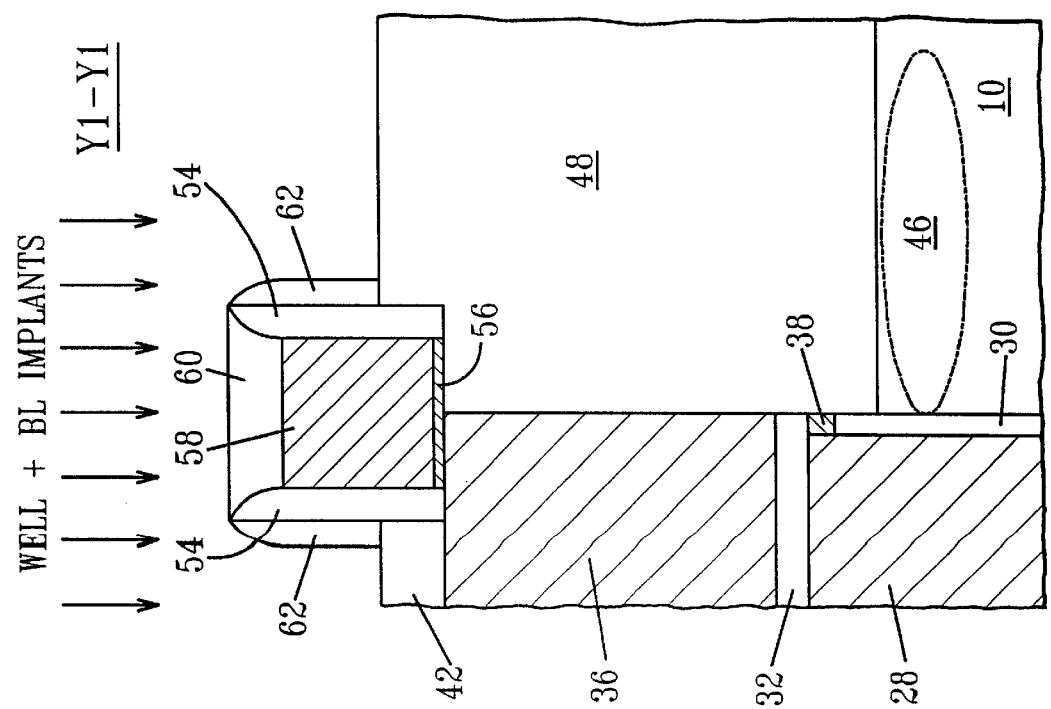

FIG. 13 shows a cross-sectional view of the structure after completing the following steps: The exposed nitride 52 is removed by RIE selective to oxide. A small amount of oxide 50 is removed utilizing any number of possible oxide etches well known in the art (anisotropic plasma etching, dry etching or wet isotropic etching) to expose pad nitride layer 14. Although this etch of the thin oxide layer also removes a small amount of the oxide over the poly GC and over the wordlines, the remaining thicknesses of the these layers are sufficient to provide their intended insulating function, allowing borderless bitline diffusion contacts to be subsequently formed. Then, a nitride selective to oxide etch is used to remove exposed pad nitride 14 to the surface of the substrate. The pad nitride is also removed in the support areas by this step. Protective oxide spacers 62 are then formed on the vertical sidewalls of the wordline using techniques well known in the art. A sacrificial oxide is grown on the surface of the substrate and wells 66 are implanted in the support and array regions. An implant is then made to form N+ diffusion (bitline diffusion) 68 in the array. The various implant steps used in forming the wells and the N+ diffusion region are well known to those skilled in the art; therefore, a detailed description regarding these implant steps is not needed herein.

Figure 14:
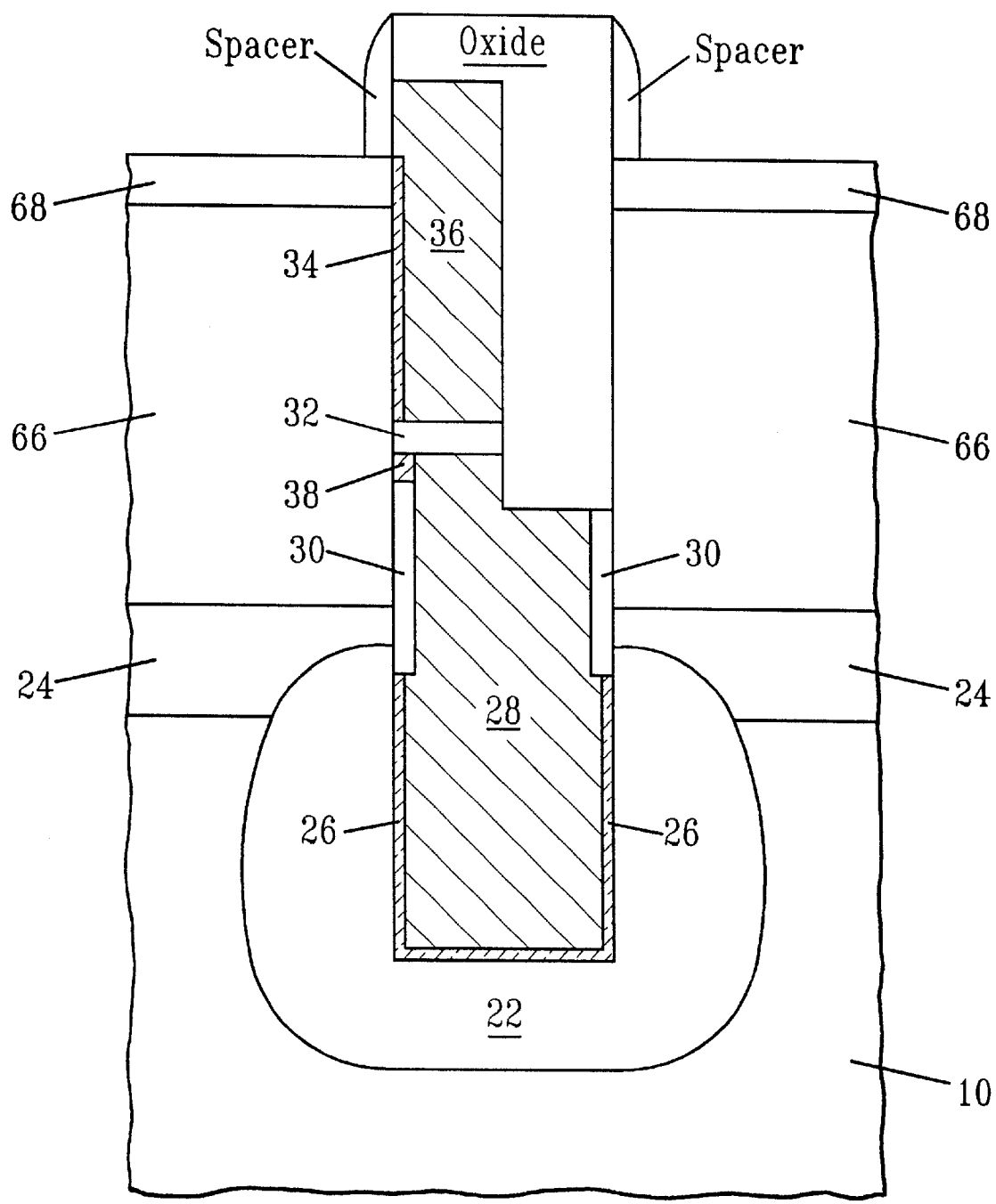

FIG. 14 is a cross-sectional view through X—X1 at this point of the process, i.e., after well and bitline diffusion implants.

The support areas of the structure are then processed using the following techniques: First, the above sacrificial oxide is removed utilizing processing techniques well known in the art. A gate oxide is grown on the surface of the substrate and a gate conductor stack is deposited for the support MOSFETs. The gate conductor stack is patterned to form the gates of the support MOSFET. The support gate mask is also used to completely remove the support gate conductor stack from the array area.

Figure 15:
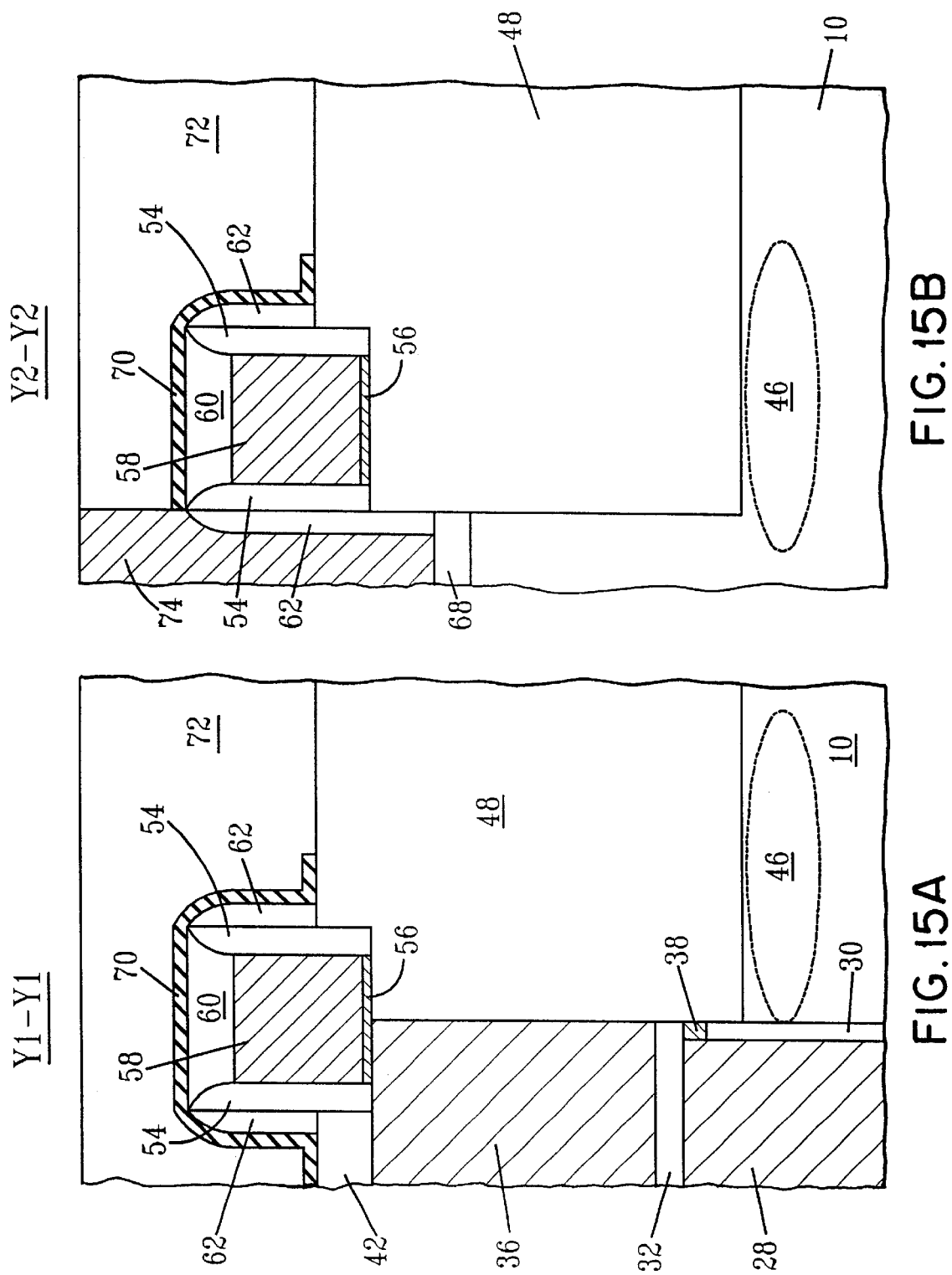

Next, as shown in FIGS. 15A–15B, a thin nitride layer 70 having a thickness of from about 4 to about 15 nm is formed about the wordline utilizing conventional deposition processes well known to those skilled in the art. A layer of boron doped phosphorus silicate glass, BPSG, 72 is deposited over the nitride layer and then the structure is planarized. Contact stud vias are then RIE'd in the BPSG stopping on the thin nitride layer. The exposed portion of the thin nitride layer is then removed utilizing removal processes well known in the art. Contact doping is implanted into the open vias and a stud conductive material 74 such as W or polysilicon is deposited and planarized. Since the vertical MOSFET is tolerant of a relatively deep bitline diffusion, W studs may be used in the array, as well as the supports. This simplifies the process for the formation of contacts.

Figure 16:
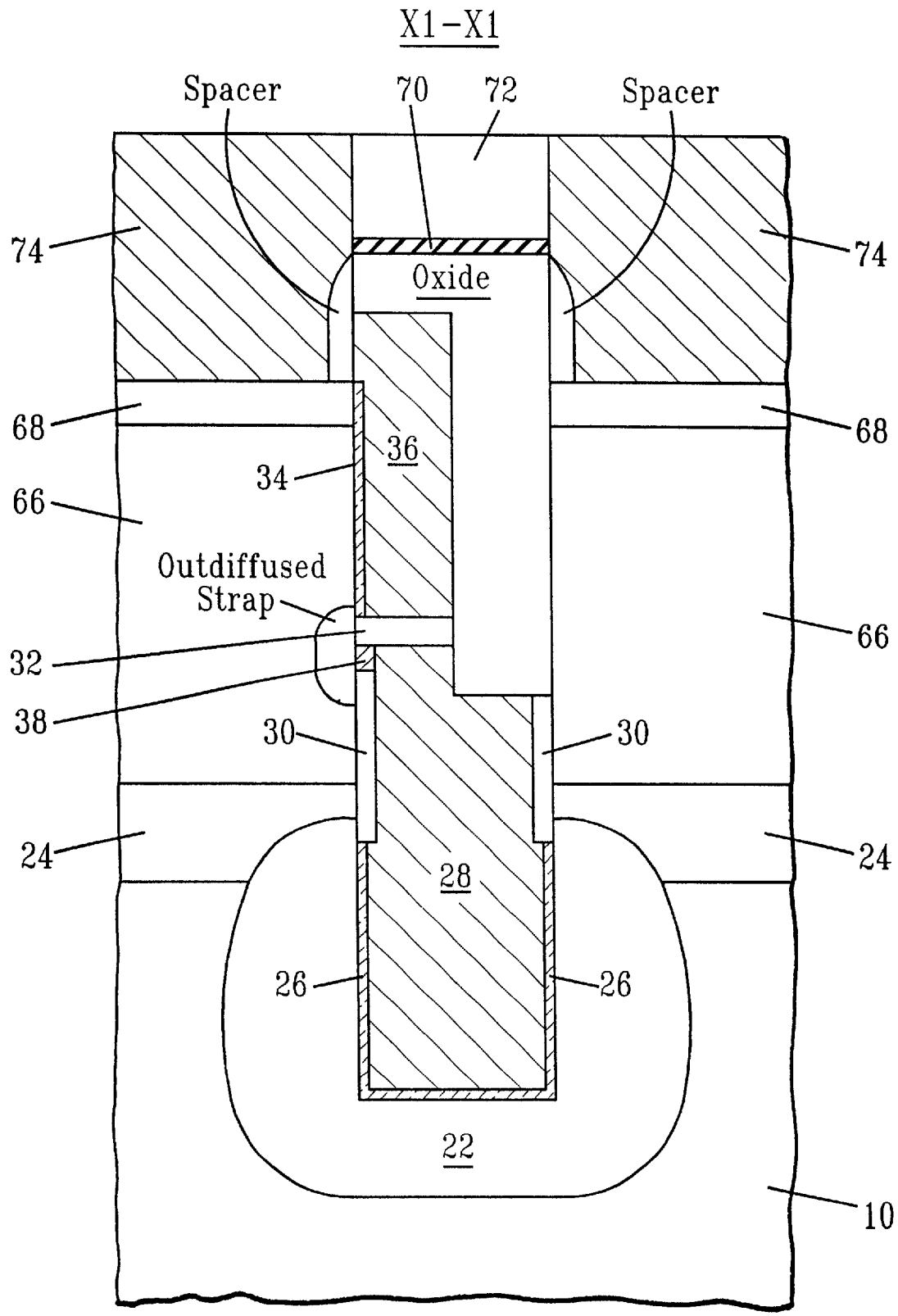

FIG. 16 is a cross-section X—X1 at this point in the process, i.e., after formation of diffusion contact studs. Conventional processing follows, which includes deposition of additional interlevel dielectric layers, formation of bitline conductors, and formation of upper wiring conductors and vias.

Figure 17:
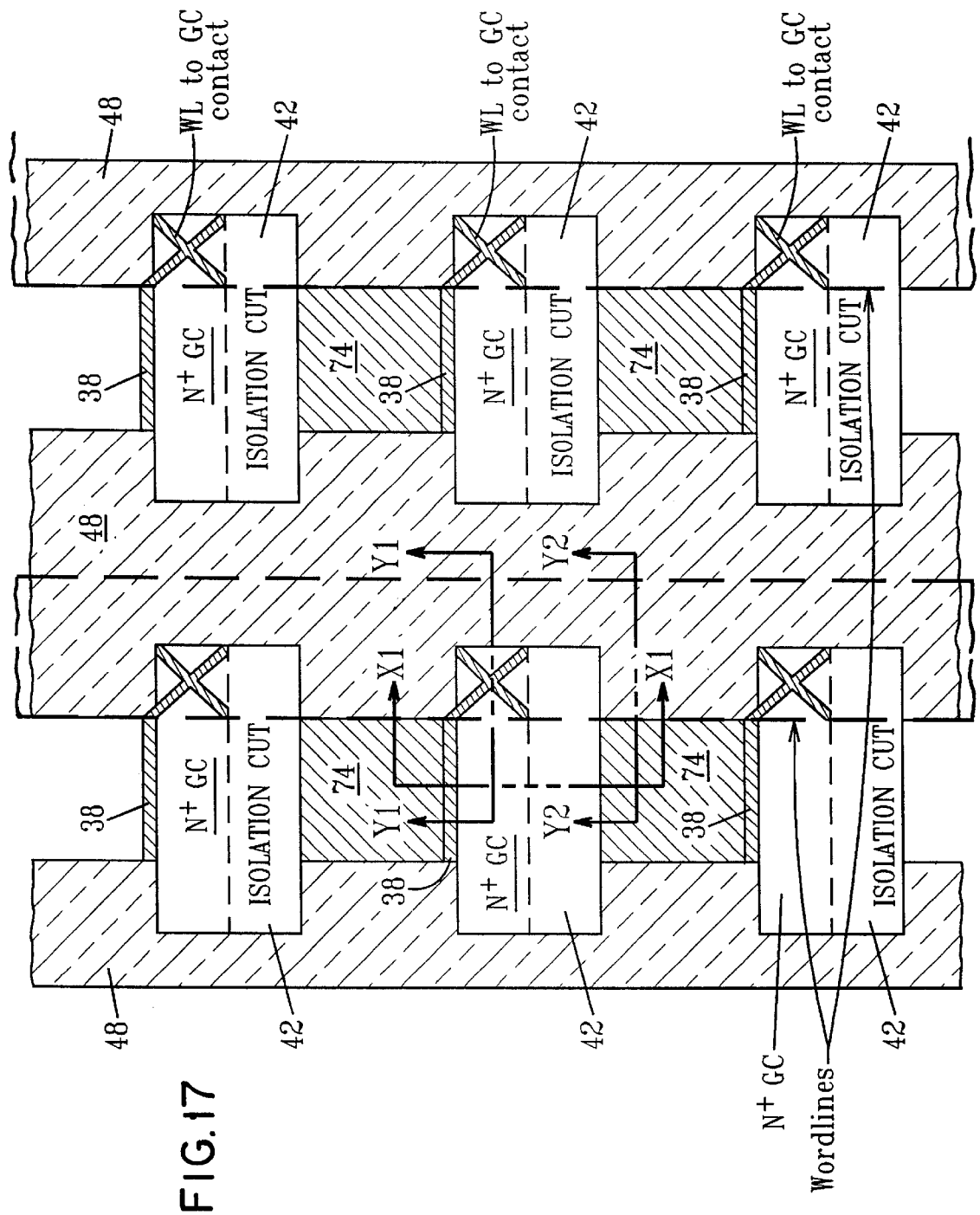

FIG. 17 represents a top view of a portion of the array showing the structure features of the bitline diffusion contact studs. It is noted that in this figure, the bitline contact studs have a 1×1 feature size.

Figure 18:
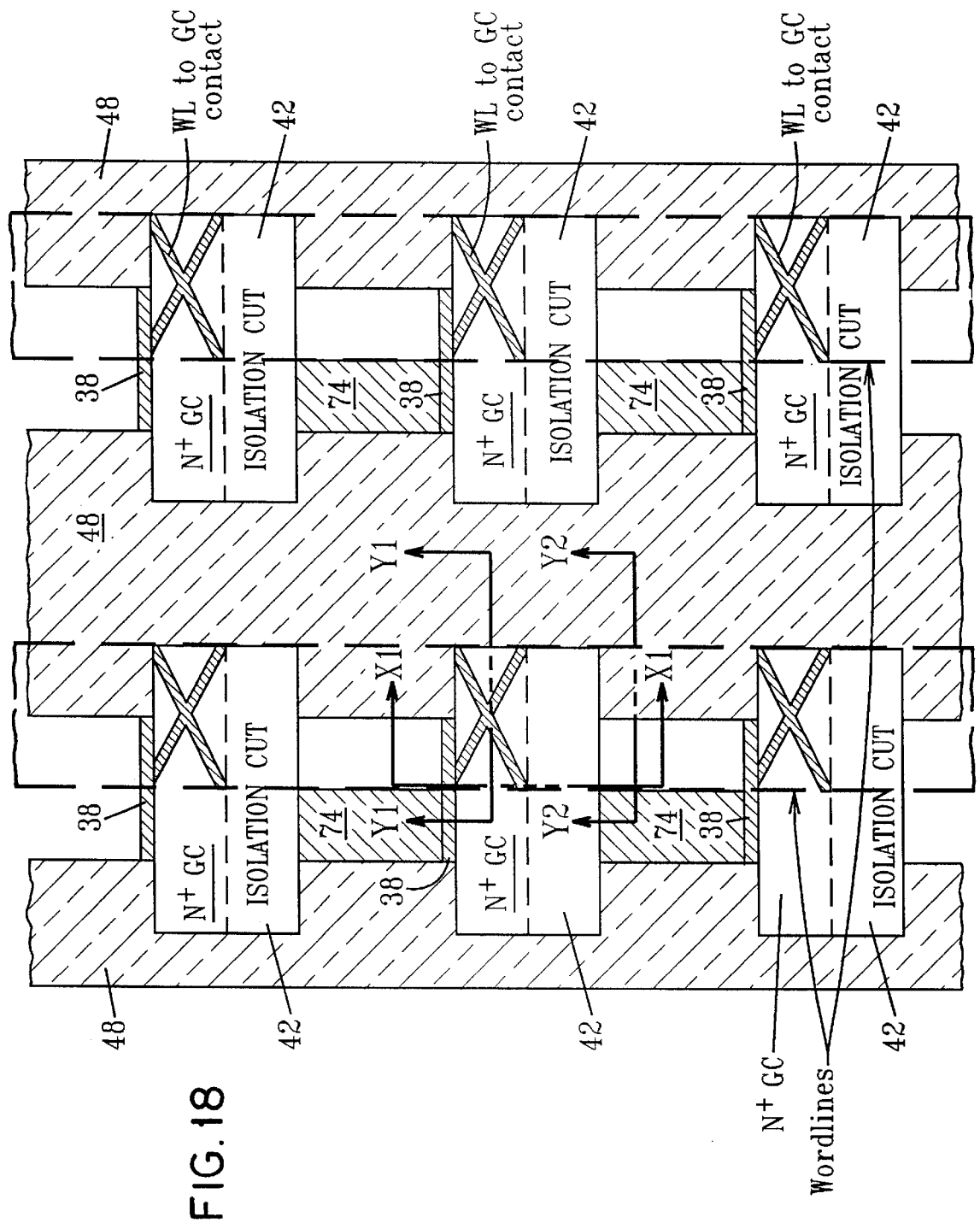
FIG. 18 depicts a preferred layout for the $6F^2$ memory cell of the present invention.

In a preferred embodiment of the present invention, the wordline mask is shifted by an additional 0.5F providing a full 1F wordline overlap of the GC. This modification which is shown in FIG. 18 improves the reliability of forming contacts between wordline and GC. Although the bitline contact stud area is reduced to 0.5F×1F, it is still adequate for forming contacts. Since the contact stud contacts are borderless to the isolation regions, DT and wordlines, with an area defined by the removal of the remaining pad nitride, there is no problem of reliably landing on the contact stud diffusion.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the spirit and scope of the appended claims.

Having thus described our invention in detail, what we claim as new, and desire to secure by the letters patent is:

1. A $6F^2$ memory cell comprising:
   a plurality of capacitors each located in a separate trench that is formed in a semiconductor substrate;
   a plurality of transfer transistors each having a vertical gate dielectric, a gate conductor, and a bitline diffusion, each transistor is located above and electrically connected to a respective trench capacitor;
   a plurality of dielectric-filled isolation trenches in a striped pattern about said transistors, said isolation trenches are spaced apart by a substantially uniform spacing;
   a respective wordline electrically contacted to each respective gate conductor, said wordline is in the same direction as the isolation trenches; and
   a plurality of bitline in contact with said a pluraity of bitline diffusions, wherein said bitline diffusions have a width that is defined by said spacing of said isolation trenches and active area of said transfer transistors is defined by the intersection of pairs of said isolation trenches and pairs of said trenches containing said capacitors.

2. The $6F^2$ memory cell of claim 1 wherein said substrate is composed of Si, Ge, SiGe, GaAs, InAs, InP, Si/SiGe or $Si/SiO_2/Si$.

3. The $6F^2$ memory cell of claim 2 wherein said substrate is composed of Si.

4. The $6F^2$ memory cell of claim 1 wherein each of said capacitors includes at least a plate electrode about an exterior region of said trench, a storage node dielectric layer lining said trench, and an inner electrode composed of N+ polysilicon.

5. The $6F^2$ memory cell of claim 1 wherein said capacitors and said transfer transistors are separated in said trench by a collar isolation region.

6. The $6F^2$ memory cell of claim 5 wherein a diffusion strap is located on one sidewall of the trench above said collar isolation region.

7. The $6F^2$ memory cell of claim 1 wherein said substrate further includes an N-band region about a lower region of said trench wherein said capacitor is located.

8. The $6F^2$ memory cell of claim 7 wherein a P-well is formed above said N-band region.

9. The $6F^2$ memory cell of claim 1 wherein a field doping region is formed beneath each isolation trench.

10. The $6F^2$ memory cell of claim 1 wherein said wordline comprises at least a wordline conductor, an oxide layer formed on a top surface of said wordline conductor and spacers formed on sidewalls of said conductor and said oxide.

11. The $6F^2$ memory cell of claim 1 wherein said wordlines are borderless to said underlying gate conductors.

12. The $6F^2$ memory cell of claim 1 wherein said bitline comprises W or polysilicon.

13. The $6F^2$ memory cell of claim 1 wherein said bitline contacts are W studs.

14. The $6F^2$ memory cell of claim 1 wherein said bitline diffusion is an N+layer that is formed in the surface of the substrate.

15. The $6F^2$ memory cell of claim 1 wherein said wordlines overlap said gate conductor.

16. The 6F memory cell of claim 1 wherein said trenches including said capacitors and said transistors have a design size of 2F×1F.

17. The $6F^2$ memory cell of claim 1 wherein said trenches including said capacitors and said transistors are substantially rectangular in design.

18. The $6F^2$ memory cell of claim 1 wherein said isolation trenches are 2F wide.

* * * * *

UNITED STATES PATENT AND TRADEMARK OFFICE
CERTIFICATE OF CORRECTION

PATENT NO. : 6,281,539 B1
DATED : August 28, 2001
INVENTOR(S) : Jack A. Mandelman et al.

It is certified that error appears in the above-identified patent and that said Letters Patent is hereby corrected as shown below:

Column 1,
Line 9, "(MOSFETS)" should read -- (MOSFETs) --

Column 8,
Line 33, "X-X1" should read -- X1-X1 --
Line 60, "X-X1" should read -- X1-X1 --

Column 9,
Line 24, "letters patent" should read -- Letters Patent --
Line 40, "pluraity" should read -- plurality --

Column 10,
Line 38, "6F" should read -- $6F^2$ --

Signed and Sealed this

Thirtieth Day of April, 2002

Attest:

Attesting Officer

JAMES E. ROGAN
Director of the United States Patent and Trademark Office